(12) United States Patent
Kugimoto

(10) Patent No.: US 10,861,730 B2
(45) Date of Patent: Dec. 8, 2020

(54) ELECTROSTATIC CHUCK DEVICE

(71) Applicant: SUMITOMO OSAKA CEMENT CO., LTD., Tokyo (JP)

(72) Inventor: Hironori Kugimoto, Tokyo (JP)

(73) Assignee: SUMITOMO OSAKA CEMENT CO., LTD., Tokyo (JP)

(*) Notice: Subject to any disclaimer, the term of this patent is extended or adjusted under 35 U.S.C. 154(b) by 583 days.

(21) Appl. No.: 15/556,556

(22) PCT Filed: Feb. 4, 2016

(86) PCT No.: PCT/JP2016/053386
§ 371 (c)(1),
(2) Date: Sep. 7, 2017

(87) PCT Pub. No.: WO2016/143427
PCT Pub. Date: Sep. 15, 2016

(65) Prior Publication Data
US 2018/0053678 A1 Feb. 22, 2018

(30) Foreign Application Priority Data
Mar. 12, 2015 (JP) .................. 2015-049463

(51) Int. Cl.
H01L 21/683 (2006.01)
H01L 21/687 (2006.01)
H01L 21/67 (2006.01)

(52) U.S. Cl.
CPC .... *H01L 21/6833* (2013.01); *H01L 21/67103* (2013.01); *H01L 21/67248* (2013.01);
(Continued)

(58) Field of Classification Search
CPC ......... H01L 21/67103; H01L 21/67248; H01L 21/6831; H01L 21/6833; H01L 21/68757;
(Continued)

(56) References Cited

U.S. PATENT DOCUMENTS

| 6,272,002 B1 | 8/2001 | Mogi et al. |
| 2014/0042716 A1* | 2/2014 | Miura ............... H01L 21/67103 279/128 |
| 2016/0276198 A1* | 9/2016 | Anada ............... H01L 21/67109 |

FOREIGN PATENT DOCUMENTS

| JP | 10-144778 A | 5/1998 |
| JP | 11-168134 A | 6/1999 |

(Continued)

OTHER PUBLICATIONS

International Search Report for PCT/JP2016/053386 (dated Apr. 26, 2016).

*Primary Examiner* — Dana Ross
*Assistant Examiner* — James F Sims, III
(74) *Attorney, Agent, or Firm* — Merchant & Gould P.C.

(57) ABSTRACT

An object is to provide an electrostatic chuck device having high heat resistance, which can be used even under high-temperature environment. An electrostatic chuck device includes: an electrostatic chuck section having a placing surface for placing a plate-shaped sample on one main surface thereof and an electrode for electrostatic adsorption; a temperature-controlling base section which is provided on the other side of the electrostatic chuck section in relation to the placing surface to cool the electrostatic chuck section; a heater element which is provided in a form of a layer between the electrostatic chuck section and the temperature-controlling base section; and a first adhesive layer which is provided between the heater element and the electrostatic chuck section to adhere the heater element and the electrostatic chuck section to each other, in which the first adhesive layer is made of inorganic glass or an inorganic material having a partially crystallized glass structure.

7 Claims, 2 Drawing Sheets

(52) U.S. Cl.
CPC .... *H01L 21/6831* (2013.01); *H01L 21/68757* (2013.01); *H01L 21/68785* (2013.01)

(58) Field of Classification Search
CPC .......... H01L 21/68785; H01J 37/32697; H01J 37/32706
USPC .............. 219/444.1; 118/724, 725, 728–730; 279/128; 361/324; 156/345.51–345.55
See application file for complete search history.

(56) References Cited

FOREIGN PATENT DOCUMENTS

| | | |
|---|---|---|
| JP | 2008-300491 A | 12/2008 |
| JP | 2013-120835 A | 6/2013 |

* cited by examiner

ELECTROSTATIC CHUCK DEVICE

The present application is a National Stage Application under 35 U.S.C. § 371 of International Application No. PCT/JP2016/053386 filed Feb. 4, 2016, which claims the benefit of priority to Japanese Patent Application No. 2015-049463 filed Mar. 12, 2015, the disclosures of all of which are hereby incorporated by reference in their entireties. The International Application was published in Japanese on Sep. 15, 2016 as WO 2016/143427.

TECHNICAL FIELD

The present invention relates to an electrostatic chuck device.

BACKGROUND

In the past, in a semiconductor manufacturing apparatus using plasma, such as a plasma etching apparatus or a plasma CVD apparatus, as a device for easily mounting and fixing a wafer onto a sample stage and maintaining the temperature of the wafer at a desired temperature, an electrostatic chuck device has been used.

As the electrostatic chuck device, for example, an electrostatic chuck device having a structure in which a plurality of members such as a ceramic substrate with a plate-shaped electrode for electrostatic adsorption buried therein, a temperature-controlling base section with a refrigerant flow path for refrigerant circulation formed in the interior thereof, and a heater which is used for controlling the temperature of a wafer form a layer structure and the respective layers are bonded together by an adhesive layer to be integrated with each other is known.

The electrostatic chuck device is heated by being exposed to high-temperature environment during use, and therefore, heat resistance is required. Further, according to improvement in various performance of recent semiconductors, the heat resistance which is required for the electrostatic chuck device also tends to become higher. Therefore, an electrostatic chuck device which can be used under higher temperature (150° C. or higher) environment than in the past has been studied (refer to, for example, Patent Literature No. 1).

CITATION LIST

Patent Literature

[Patent Literature No. 1] Japanese Laid-open Patent Publication No. 2013-120835

SUMMARY OF INVENTION

Technical Problem

Patent Literature No. 1 discloses, as a method of forming a heater (a heating element), a method in which a thin film of nickel or copper is formed on the surface of a ceramic substrate by various film formation methods such as a plating method, a sputtering method, a vapor deposition method, and a thermal spraying method, and thereafter, unnecessary portions are removed by etching.

In this method, variation easily occurs in the thickness of the thin film which is formed on the surface of the substrate, and as a result, a heater which is formed includes portions having different thicknesses. If the heater has variation in thickness, the amount of heat generation varies according to sites of the heater and this causes a temperature difference in the plane of a wafer.

Therefore, the inventor of the present invention proposed that an electrostatic chuck device in which variation in the thickness of a heater is eliminated can be manufactured by forming a heater pattern by attaching a metal thin film, in which variation in thickness falls within an allowable range, to the surface of a ceramic substrate in advance, and then etching the metal thin film. In this method, when attaching the substrate and the metal thin film to each other, an adhesive layer having high heat resistance is formed by using an organic adhesive agent having high heat resistance, such as an epoxy adhesive agent, a polyimide adhesive agent, or a silicone adhesive agent.

The "heat resistance of an adhesive layer" means that the adhesive layer is not dissolved or decomposed by applied heat and can maintain a constant state. For example, an "adhesive layer having heat resistance of 200° C. or higher" means that the adhesive layer is not dissolved or decomposed even if it reaches a temperature of 200° C.

However, in the case of an electrostatic chuck device in which the organic adhesive agent as described above is used for a material for forming the adhesive layer between the substrate and the heater, there is a concern that various problems such as deformation of the substrate or peeling-off of the heater may occur due to deterioration of the adhesive layer or a difference in coefficient of thermal expansion between the ceramic substrate and the adhesive layer. Such problems tend to become obvious in a case where the electrostatic chuck device is used under high-temperature environment of 200° C. or higher, and thus a technique for improvement is required.

The present invention has been made in view of such circumstances and has an object to provide an electrostatic chuck device having high heat resistance, which can be used even under high-temperature environment.

Solution to Problem

In order to solve the above problems, according to an aspect of the present invention, there is provided an electrostatic chuck device including: an electrostatic chuck section having a placing surface for placing a plate-shaped sample on one main surface thereof and an electrode for electrostatic adsorption; a temperature-controlling base section which is provided on the other side of the electrostatic chuck section in relation to the placing surface to cool the electrostatic chuck section; a heater element which is provided in a form of a layer between the electrostatic chuck section and the temperature-controlling base section; and a first adhesive layer which is provided between the heater element and the electrostatic chuck section to adhere the heater element and the electrostatic chuck section to each other, in which the first adhesive layer is made of an inorganic glass or an inorganic material having a partially crystallized glass structure.

In the aspect of the present invention, a configuration is also acceptable in which the electrostatic chuck device further includes an inorganic ceramic membrane provided between the heater element and the temperature-controlling base section and the heater element is embedded with the first adhesive layer and the inorganic ceramic membrane.

In the aspect of the present invention, a configuration is also acceptable in which the inorganic ceramic membrane is a thermally-sprayed ceramic coating.

In the aspect of the present invention, a configuration is also acceptable in which the thermally-sprayed ceramic coating is a thermally-sprayed coating of aluminum oxide or yttrium oxide.

In the aspect of the present invention, a configuration is also acceptable in which the electrostatic chuck device further includes a second adhesive layer provided between the inorganic ceramic membrane and the temperature-controlling base section and the second adhesive layer includes an organic adhesive agent.

In the aspect of the present invention, a configuration is also acceptable in which, when a coefficient of thermal expansion of the electrostatic chuck section is A, a coefficient of thermal expansion of the heater element is B, and a coefficient of thermal expansion of the first adhesive layer is C; then, there is a relationship among these coefficients: $A<C<B$ or $A>C>B$.

In the aspect of the present invention, a configuration is also acceptable in which the first adhesive layer is a green sheet.

In the aspect of the present invention, a configuration is also acceptable in which, when a coefficient of thermal expansion of the heater element is B, a coefficient of thermal expansion of the first adhesive layer is C, and a coefficient of thermal expansion of the inorganic ceramic membrane is D; then there is a relationship among these coefficients: $B<D<C$ or $B>D>C$.

Advantageous Effects of Invention

According to the present invention, it is possible to provide an electrostatic chuck device having high heat resistance, which can be used even under high-temperature environment.

DESCRIPTION OF EMBODIMENTS

Hereinafter, an electrostatic chuck device according to this embodiment will be described with reference to FIGS. 1 and 2. In all of the following drawings, in order to make the drawings easier to see, dimensions, ratios, or the like of the respective constituent elements is appropriately changed.

Figure 1:
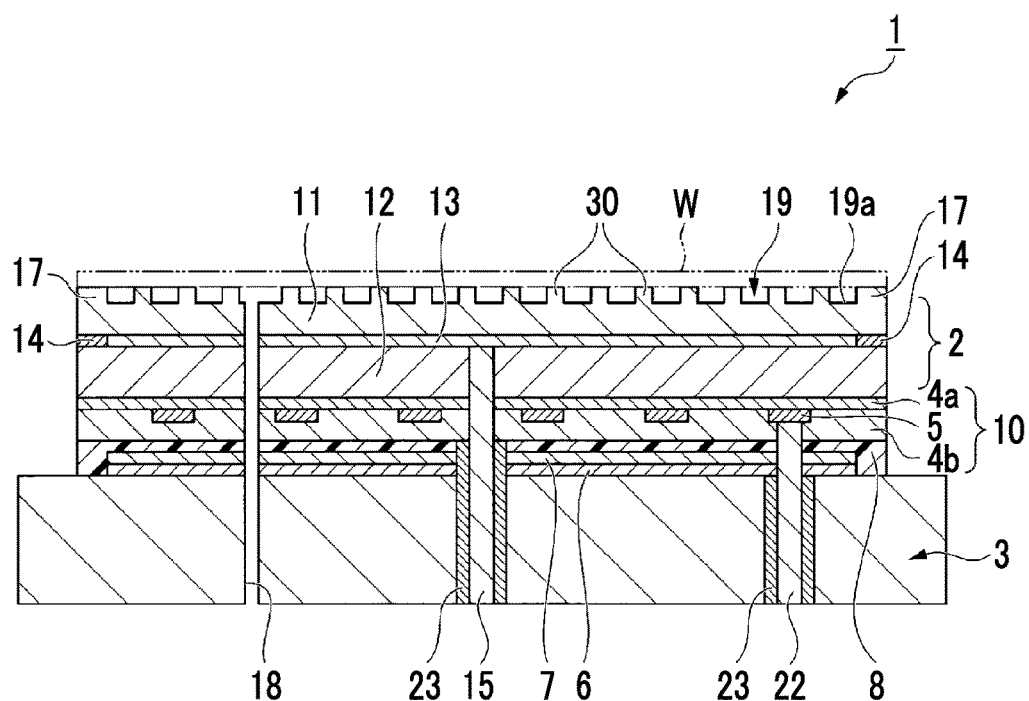
FIG. 1 is a cross-sectional view of an electrostatic chuck device according to an embodiment.

FIG. 1 is a cross-sectional view of an electrostatic chuck device 1. As shown in the drawing, the electrostatic chuck device 1 is provided with a disk-shaped electrostatic chuck section 2, a thick disk-shaped temperature-controlling base section 3 which controls the temperature of the electrostatic chuck section 2 to a desired temperature, and a heater section 10 bonded to the lower surface of the electrostatic chuck section 2. Further, the electrostatic chuck device 1 has an insulating member 7 bonded to the upper surface of the temperature-controlling base section 3 through an adhesive material 6, and a second adhesive layer 8 made of an organic adhesive agent or the like, which bonds and integrates the heater section 10 on the lower surface of the electrostatic chuck section 2 and the insulating member 7 on the temperature-controlling base section 3 in a state where the heater section 10 and the insulating member 7 face each other.

A cooling gas introduction hole 18 which penetrates the electrostatic chuck section 2, the second adhesive layer 8, the insulating member 7, the adhesive material 6, and the temperature-controlling base section 3 is formed in the electrostatic chuck device 1. Cooling gas such as He is supplied from the cooling gas introduction hole 18. The cooling gas flows through a gap between a placing surface 19 of the electrostatic chuck section 2 and the lower surface of a plate-shaped sample W and serves to lower the temperature of the plate-shaped sample W.

The electrostatic chuck section 2 has a placing plate 11 having an upper surface serving as the placing surface 19 on which the plate-shaped sample W such as a semiconductor wafer is placed, a supporting plate 12 which is integrated with the placing plate 11 and supports the placing plate 11, an internal electrode for electrostatic adsorption 13 and an insulating material layer 14 insulating the surroundings of the internal electrode for electrostatic adsorption 13, which are provided between the placing plate 11 and the supporting plate 12, and a power supply terminal 15 which is provided to penetrate the supporting plate 12 and applies a direct-current voltage to the internal electrode for electrostatic adsorption 13.

As shown in the drawing, a plurality of protrusions 30 each having a diameter smaller than the thickness of the plate-shaped sample W are formed on the placing surface 19 of the electrostatic chuck section 2. The electrostatic chuck device 1 has a configuration in which the plurality of protrusions 30 support the plate-shaped sample W.

Further, a peripheral wall 17 is formed at a peripheral portion of the placing surface 19. The peripheral wall 17 is formed at the same height as the protrusion 30 and supports the plate-shaped sample W together with the protrusions 30. The peripheral wall 17 is provided in order to prevent the leakage of the cooling gas which is introduced between the placing surface 19 and the plate-shaped sample W.

The placing plate 11 and the supporting plate 12 have disk shapes in which the shapes of the superimposed surfaces are the same, and each of the placing plate 11 and the supporting plate 12 is made of an insulating ceramic sintered compact having mechanical strength and having durability against corrosive gas and plasma thereof, such as an aluminum oxide-silicon carbide ($Al_2O_3$—SiC) compound sintered compact, an aluminum oxide ($Al_2O_3$) sintered compact, an aluminum nitride (AlN) sintered compact, or an yttrium oxide ($Y_2O_3$) sintered compact.

The average particle diameter of ceramic particles in the ceramic sintered compact is preferably 10 μm or less and more preferably 2 μm or less. Sandblasting is performed in a process of forming the protrusions 30 which are provided on the placing surface 19 of the electrostatic chuck section 2. The sandblasting process is a process of damaging and excavating the surface of the placing surface 19, and therefore, cracks remain inside of the protrusions 30. The cracks are forcibly removed in advance by buffing which is performed after the sandblasting process.

The cracks are formed at grain boundaries of the ceramic particles in the ceramic sintered compact. Therefore, in a case where the particle diameter of the ceramic particle is large, corners are greatly removed along the grain boundaries by undergoing the buffing. The larger the particle diameter of the ceramic particle is, the more rounded the shape of the protrusion 30 is. As will be described later, since it is preferable that the protrusion 30 of this embodiment does not have a change in cross-sectional area in a height direction, it is preferable that the protrusion 30 is not rounded. By setting the average particle diameter of the ceramic particles to be 10 µm or less (more preferably, 2 µm or less), it is possible to form the protrusion 30, in which a change in cross-sectional area in the height direction is suppressed, on the placing surface 19.

The total thickness of the placing plate 11, the supporting plate 12, the internal electrode for electrostatic adsorption 13, and the insulating material layer 14, that is, the thickness of the electrostatic chuck section 2 is preferably 0.5 mm or more and 5.0 mm or less. If the thickness of the electrostatic chuck section 2 is less than 0.5 mm, it is not possible to secure the mechanical strength of the electrostatic chuck section 2. On the other hand, if the thickness of the electrostatic chuck section 2 exceeds 5.0 mm, the heat capacity of the electrostatic chuck section 2 becomes too large, and thus the thermal responsiveness of the plate-shaped sample W which is placed thereon deteriorates, and furthermore, due to an increase in thermal conduction in a lateral direction of the electrostatic chuck section 2, it becomes difficult to maintain the in-plane temperature of the plate-shaped sample W at a desired temperature pattern.

In particular, the thickness of the placing plate 11 is preferably 0.3 mm or more and 2.0 mm or less. If the thickness of the placing plate 11 is less than 0.3 mm, there is a concern that electric discharge may occur due to the voltage applied to the internal electrode for electrostatic adsorption 13. On the other hand, if the thickness of the placing plate 11 exceeds 2.0 mm, the plate-shaped sample W cannot be sufficiently adsorbed and fixed, and therefore, it becomes difficult to sufficiently heat the plate-shaped sample W.

The internal electrode for electrostatic adsorption 13 is used as an electrode for an electrostatic chuck for generating electric charges and fixing the plate-shaped sample W with an electrostatic adsorption force, and the shape or the size thereof is appropriately adjusted according to a use thereof.

The internal electrode for electrostatic adsorption 13 is formed of conductive ceramic such as an aluminum oxide-tantalum carbide ($Al_2O_3$—$Ta_4C_5$) conductive compound sintered compact, an aluminum oxide-tungsten ($Al_2O_3$—W) conductive compound sintered compact, an aluminum oxide-silicon carbide ($Al_2O_3$—SiC) conductive compound sintered compact, an aluminum nitride-tungsten (AlN—W) conductive compound sintered compact, an aluminum nitride-tantalum (AlN—Ta) conductive compound sintered compact, or an yttrium oxide-molybdenum ($Y_2O_3$—Mo) conductive compound sintered compact, or high melting point metal such as tungsten (W), tantalum (Ta), or molybdenum (Mo).

The thickness of the internal electrode for electrostatic adsorption 13 is not particularly limited. However, the thickness is preferably 0.1 µm or more and 100 µm or less and particularly preferably 5 µm or more and 20 µm or less.

If the thickness is less than 0.1 µm, sufficient electrical conductivity cannot be secured. On the other hand, if the thickness exceeds 100 µm, cracking easily occurs in the joint interface between the internal electrode for electrostatic adsorption 13, and the placing plate 11 and the supporting plate 12 due to a difference in coefficient of thermal expansion between the internal electrode for electrostatic adsorption 13, and the placing plate 11 and the supporting plate 12.

The internal electrode for electrostatic adsorption 13 having such a thickness can be easily formed by a film formation method such as a sputtering method or a vapor deposition method, or a coating method such as a screen printing method.

The insulating material layer 14 surrounds the internal electrode for electrostatic adsorption 13 so as to protect the internal electrode for electrostatic adsorption 13 from corrosive gas and plasma thereof. Further, the insulating material layer 14 is for joining and integrating boundary portions of the placing plate 11 and the supporting plate 12, that is, outer peripheral portion regions other than the internal electrode for electrostatic adsorption 13. The insulating material layer 14 is configured of an insulating material having the same composition or the same main component as the material configuring the placing plate 11 and the supporting plate 12.

The power supply terminal 15 is a rod-shaped member provided in order to apply a direct-current voltage to the internal electrode for electrostatic adsorption 13, and a material of the power supply terminal 15 is not particularly limited as long as it is an electrically conductive material having excellent heat resistance. It is preferable that the power supply terminal 15 has a coefficient of thermal expansion close to the coefficients of thermal expansion of the internal electrode for electrostatic adsorption 13 and the supporting plate 12, and for example, conductive ceramic configuring the internal electrode for electrostatic adsorption 13 or a metal material such as tungsten (W), tantalum (Ta), molybdenum (Mo), niobium (Nb), or a kovar alloy is suitably used.

The power supply terminal 15 is insulated from the temperature-controlling base section 3 by an insulator 23 having insulation properties.

Further, the power supply terminal 15 is joined to and integrated with the supporting plate 12 and the placing plate 11 and the supporting plate 12 are joined to and integrated with each other by the internal electrode for electrostatic adsorption 13 and the insulating material layer 14, thereby configuring the electrostatic chuck section 2.

The coefficient of thermal expansion of the electrostatic chuck section 2 is not particularly limited. In the electrostatic chuck device 1, there is a case where a material for forming the placing plate 11 or the supporting plate 12 of the electrostatic chuck section 2 is changed in accordance with various uses such as etching or CVD. Further, in the electrostatic chuck section 2, the coefficient of thermal expansion of the placing plate 11 or the supporting plate 12 dominantly affects the coefficient of thermal expansion of the entire electrostatic chuck section 2. For this reason, the coefficient of thermal expansion of the electrostatic chuck section 2 becomes substantially equal to the coefficient of thermal expansion of a ceramic material selected in accordance with various uses of the electrostatic chuck device 1.

The temperature-controlling base section 3 is for adjusting the temperature of the electrostatic chuck section 2 to a desired temperature and has a thick disk shape.

As the temperature-controlling base section 3, for example, a water-cooled base or the like, in which a flow path (not shown) for circulating water is formed in the interior thereof, is suitable.

As a material configuring the temperature-controlling base section 3, it is not particularly limited as long as it is metal which is excellent in thermal conductivity, electric conductivity, and workability, or a compound material which includes the metal, and for example, aluminum (Al), an aluminum alloy, copper (Cu), a copper alloy, stainless steel (SUS), or the like is suitably used. It is preferable that at least the surface which is exposed to plasma, of the temperature-controlling base section 3, is subjected to alumite treatment or has an insulating film such as alumina formed thereon.

The heater section 10 has a first adhesive layer 4a bonded to the lower surface of the electrostatic chuck section 2, a heater element 5 bonded to the lower surface of the first adhesive layer 4a and having a predetermined pattern, and an inorganic ceramic membrane 4b provided so as to cover the heater element 5 from the lower surface of the heater element 5.

The first adhesive layer 4a is a layer which uses an inorganic adhesive agent as a forming material thereof and bonds the heater element 5 to the electrostatic chuck section 2. The thickness of the first adhesive layer 4a is preferably in a range of 5 μm to 100 μm and more preferably in a range of 10 μm to 50 μm.

The inorganic adhesive agent which is the material for forming the first adhesive layer 4a is an adhesive agent which contains silica ($SiO_2$), alumina ($Al_2O_3$), zirconia ($ZrO_2$), or the like as its main component and has a vitreous or partially crystallized structure by being cured by heat or the like. A filler such as silicon carbide (SiC) or aluminum nitride (AlN) may be introduced into an inorganic adhesive material in order to adjust the thermal conductivity.

As such an inorganic adhesive agent, specifically, gel-like adhesive agent such as Aron Ceramic manufactured by Toagosei Co., Ltd., Sumiceram S manufactured by Asahi Chemical Industry Co., Ltd., Celamabond manufactured by Aremco Co., Ltd., or Heat-resistant inorganic adhesive agent 3700 series manufactured by ThreeBond Co., Ltd. can be given as an example.

Further, in order to uniformize the in-plane temperatures of the electrostatic chuck section 2 and a silicon wafer W which is placed thereon, a configuration in which the layer thickness of the adhesive layer 4a is made to be uniform so as to make the heat conduction from below the electrostatic chuck section 2 uniform is preferable. For this reason, as the material for forming the first adhesive layer 4a, it is preferable to use a sheet-shaped inorganic adhesive agent which is generally referred to as a green sheet, rather than the above-described gel-like adhesive agent. The green sheet is formed by molding inorganic oxide particles such as silica or alumina and a resin binder into a sheet shape having a uniform thickness. If the green sheet is used, unlike the gel-like adhesive agent, a change in layer thickness due to coating unevenness does not occur, and therefore, it becomes possible to easily make the layer thickness of the adhesive layer 4a uniform.

The first adhesive layer 4a formed in this way is made of inorganic glass and an inorganic material having a partially crystallized glass structure.

It is preferable that the coefficient of thermal expansion of the first adhesive layer 4a is larger than the coefficient of thermal expansion of the electrostatic chuck section 2 and smaller than the coefficient of thermal expansion of the metal which is used for the heater element 5, or is smaller than the coefficient of thermal expansion of the electrostatic chuck section 2 and larger than the coefficient of thermal expansion of the metal which is used for the heater element 5. That is, in the electrostatic chuck device 1 of this embodiment, when the coefficient of thermal expansion of the electrostatic chuck section 2 is set to be A, the coefficient of thermal expansion of the heater element 5 is set to be B, and the coefficient of thermal expansion of the first adhesive layer 4a is set to be C, it is favorable if the relationship of A<C<B or A>C>B is satisfied.

Further, when the average value (arithmetic average value) of the coefficient of thermal expansion A of the electrostatic chuck section 2 and the coefficient of thermal expansion B of the heater element 5 is X=(A+B)/2 and the absolute value of the difference between the coefficient of thermal expansion A and the average value X or the absolute value of the difference between the coefficient of thermal expansion B and the average value X is Y=|B−A|/2, the coefficient of thermal expansion C of the first adhesive layer 4a is preferably X−0.8Y≤C≤X+0.8Y and further preferably X−0.6Y≤C≤X+0.6Y. In this way, in a case where the electrostatic chuck section 2 and the metal which is used for the heater element 5 are bonded together using the first adhesive layer 4a, it becomes difficult for peeling-off to occur even by repetitive use (raising and lowering temperature).

It is preferable that variation in the in-plane thickness of the first adhesive layer 4a is within 10 μm. If variation in the in-plane thickness of the first adhesive layer 4a exceeds 10 μm, variation exceeding 10 μm occurs in the in-plane distance between the electrostatic chuck section 2 and the heater element 5. As a result, in-plane uniformity of the heat which is transmitted from the heater element 5 to the electrostatic chuck section 2 decreases, so that the in-plane temperature of the placing surface 19 of the electrostatic chuck section 2 becomes non-uniform, and therefore, it is not preferable.

The heater element 5 is bonded and fixed to the lower surface of the supporting plate 12 by the first adhesive layer 4a. The heater element 5 is a single continuous strip-shaped heater pattern formed by meandering a strip-shaped metal material having a narrow width. Power supply terminals 22 shown in FIG. 1 are connected to both end portions of the strip-shaped heater element 5, and the power supply terminal 22 is insulated from the temperature-controlling base section 3 by the insulator 23 having insulation properties.

The heater pattern of the heater element 5 may be configured by a single heater pattern. However, the heater pattern may be configured by two or more mutually independent heater patterns. By individually controlling a plurality of mutually independent heater patterns, it is possible to freely control the temperature of the plate-shaped sample W which is being processed.

The heater element 5 is formed by etching a nonmagnetic metal thin plate, for example, a titanium (Ti) thin plate, a tungsten (W) thin plate, a molybdenum (Mo) thin plate, or the like, having a constant thickness of 0.2 mm or less, preferably 0.1 mm or less, into a desired heater pattern by a photolithography method.

The coefficient of thermal expansion of the heater element 5 is not particularly limited. The coefficient of thermal expansion of the heater element 5 is the coefficient of thermal expansion of a metal material, the temperature of which can be raised to a desired temperature due to resistance heat generation at the time of energization, in accordance with various uses of the electrostatic chuck device 1 as described above.

The reason for setting the thickness of the heater element 5 to 0.2 mm or less is because, if the thickness exceeds 0.2 mm, the pattern shape of the heater element 5 is reflected as the temperature distribution of the plate-shaped sample W, whereby it becomes difficult to maintain the in-plane temperature of the plate-shaped sample W at a desired temperature pattern.

Further, if the heater element 5 is formed of nonmagnetic metal, even if the electrostatic chuck device 1 is used in a high frequency atmosphere, the heater element 5 does not perform self-heating due to a high frequency. Therefore, it becomes easy to maintain the in-plane temperature of the plate-shaped sample W at a desired constant temperature or a constant temperature pattern, and therefore, it is preferable.

Further, by forming the heater element 5 by using a nonmagnetic metal thin plate having a constant thickness, the thickness of the heater element 5 becomes constant over the entire heating surface. In this way, it is possible to make the amount of heat generation of the heater element 5 constant over the entire heating surface, and thus it is possible to make the temperature distribution on the placing surface 19 of the electrostatic chuck section 2 uniform.

The inorganic ceramic membrane 4b is provided so as to cover the heater element 5 from the lower surface. The inorganic ceramic membrane 4b fills the gaps of the heater pattern of the heater element 5. For this reason, the heater element 5 is surrounded by the first adhesive layer 4a and the inorganic ceramic membrane 4b and sealed by the first adhesive layer 4a and the inorganic ceramic membrane 4b.

As the inorganic ceramic membrane 4b, a material containing alumina or yttria ($Y_2O_3$) as its main component can be used. Further, the inorganic ceramic membrane 4b may be a single phase or may be a mixed phase. Further, the inorganic ceramic membrane 4b may be a single layer or may be a multilayer structure made of two or more layers.

As the inorganic ceramic membrane 4b, a thermally-sprayed coating provided by plasma-spraying ceramic by flame spraying, plasma spraying, laser spraying, or the like can be suitably used. Further, the inorganic ceramic membrane 4b may include a binder such as epoxy which is used for bonding of thermally-sprayed ceramic particles, or an adhesive component with the heater element 5. Further, it is possible to use the inorganic glass and the inorganic material having a partially crystallized glass structure, as described for the first adhesive layer 4a.

It is preferable that the coefficient of thermal expansion of the inorganic ceramic membrane 4b is larger than the coefficient of thermal expansion of the first adhesive layer 4a and smaller than the coefficient of thermal expansion of the metal which is used for the heater element 5, or is smaller than the coefficient of thermal expansion of the first adhesive layer 4a and larger than the coefficient of thermal expansion of the metal which is used for the heater element 5. That is, in the electrostatic chuck device 1 of this embodiment, when the coefficient of thermal expansion of the heater element 5 is set to be B, the coefficient of thermal expansion of the first adhesive layer 4a is set to be C, and the coefficient of thermal expansion of the inorganic ceramic membrane 4b is set to be D, it is favorable if the relationship of B<D<C or B>D>C is satisfied.

Further, when the average value (arithmetic average value) of the coefficient of thermal expansion C of the first adhesive layer 4a and the coefficient of thermal expansion B of the heater element 5 is M=(B+C)/2 and the absolute value of the difference between the coefficient of thermal expansion B and the average value M or the absolute value of the difference between the coefficient of thermal expansion C and the average value M is N=|B−C|/2, the coefficient of thermal expansion D of the inorganic ceramic membrane 4b is preferably M−0.8N≤D≤M+0.8N and further preferably M−0.6N≤D≤M+0.6N. In this way, in a case where the first adhesive layer 4a and the heater element 5 are bonded together, it is difficult for peeling-off to occur even by repetitive use (raising and lowering temperature).

The adhesive material 6 is for bonding the insulating member 7 to the upper surface of the temperature-controlling base section 3. The adhesive material 6 is a sheet-shaped or film-shaped adhesive resin having heat resistance and insulation properties, such as polyimide resin, silicone resin, or epoxy resin, and the thickness thereof is preferably in a range of 5 μm to 100 μm and more preferably in a range of 10 μm to 50 μm.

It is preferable that variation in the in-plane thickness of the adhesive material 6 is within 10 μm. If variation in the in-plane thickness of the adhesive material 6 exceeds 10 μm, variation exceeding 10 μm occurs in the gap between the temperature-controlling base section 3 and the insulating member 7. As a result, in-plane uniformity of the temperature control of the electrostatic chuck section 2 by the temperature-controlling base section 3 decreases, so that the in-plane temperature of the placing surface 19 of the electrostatic chuck section 2 becomes non-uniform, and therefore, it is not preferable.

The insulating member 7 is a film-shaped or sheet-shaped resin having insulation properties and a withstand voltage property, such as polyimide resin, silicone resin, or epoxy resin, and it is preferable that variation in the in-plane thickness of the insulating member 7 is within 10 μm.

If variation in the in-plane thickness of the insulating member 7 exceeds 10 μm, a difference in height occurs in a temperature distribution according to the magnitude of the thickness. As a result, temperature control by the thickness adjustment of the insulating member 7 is adversely affected, and therefore, it is not preferable.

The thermal conductivity of the insulating member 7 is preferably 0.05 W/mK or more and 0.5 W/mK or less and more preferably 0.1 W/mK or more and 0.25 W/mK or less.

If the thermal conductivity is less than 0.1 W/mK, the heat conduction from the electrostatic chuck section 2 to the temperature-controlling base section 3 through the insulating member 7 becomes difficult, so that a cooling rate decreases, and therefore, it is not preferable. On other hand, if the thermal conductivity exceeds 1 W/mK, the heat conduction from the heater section to the temperature-controlling base section 3 through the insulating member 7 increases, so that a rate of temperature rise decreases, and therefore, it is not preferable.

The second adhesive layer 8 is interposed between the lower surface of the electrostatic chuck section 2 and the upper surface of the temperature-controlling base section 3. The second adhesive layer 8 bonds and integrates the electrostatic chuck section 2 with the heater element 5 bonded thereto and the temperature-controlling base section 3 together and has a thermal stress relaxation action.

It is desirable that the second adhesive layer 8 has few voids or defects in the interior thereof or the interface between the lower surface of the electrostatic chuck section 2, the lower surface of the heater element 5, and the upper surface of the temperature-controlling base section 3. If the voids or the defects are formed, the thermal conductivity decreases, and thus there is a concern that the temperature uniformity of the plate-shaped sample W may be hindered.

The second adhesive layer 8 is formed of, for example, a cured body obtained by thermally curing a silicone resin composition, or acrylic resin. It is preferable that the second adhesive layer 8 is formed by filling a resin composition having fluidity between the electrostatic chuck section 2 and the temperature-controlling base section 3 and then thermally curing the resin composition. The heater element 5 is provided on the lower surface of the electrostatic chuck section 2, so that irregularities are formed on the lower surface.

Further, the upper surface of the temperature-controlling base section 3 and the lower surface of the electrostatic chuck section 2 are not necessarily flat. By forming the second adhesive layer 8 by filling the fluid resin composition between the temperature-controlling base section 3 and the electrostatic chuck section 2 and then curing the resin composition, it is possible to suppress the occurrence of voids in the second adhesive layer 8 due to the irregularities of the electrostatic chuck section 2 and the temperature-controlling base section 3. In this way, it is possible to make the thermal conduction characteristics of the second adhesive layer 8 uniform in the plane, and thus it is possible to enhance the temperature uniformity of the electrostatic chuck section 2.

The electrostatic chuck device 1 of this embodiment has the configuration as described above.

In an electrostatic chuck device of the related art, a configuration is known in which a heater element is stuck to a ceramic plate (an electrostatic chuck section) by using an organic adhesive agent. However, in the case of such a configuration, if an electrostatic chuck device is used under a high-temperature (for example, 200° C. or more) use condition, an adhesive layer formed by curing the organic adhesive agent is deteriorated or softened due to heat, and thus the adhesive force decreases, and as a result, there is a case where peeling occurs at the interface between the heater element and the adhesive layer. Further, the adhesive layer cures and shrinks due to heat, and thus there is a case where the distance or the heat transfer coefficient between the heater element and the electrostatic chuck section becomes non-uniform according to places. In an electrostatic chuck device in which such deterioration occurred, a temperature difference is easily generated in the plane of a plate-shaped sample (a wafer).

In contrast, in the electrostatic chuck device of this embodiment, the first adhesive layer 4a which is formed by using an inorganic adhesive agent is used for the bonding of the heater element 5 and the electrostatic chuck section 2. For this reason, even under a high-temperature use condition, the electrostatic chuck device can be used without occurrence of trouble caused by thermal deterioration of the first adhesive layer 4a, unlike the electrostatic chuck device of the related art.

Further, the coefficient of thermal expansion of the adhesive layer formed by curing the organic adhesive agent is considerably larger than the coefficient of thermal expansion of the electrostatic chuck section or the heater element. For this reason, in the case of the configuration of the above electrostatic chuck device of the related art, the adhesive layer greatly thermally expands under a high-temperature use condition, and thus there is a case where the electrostatic chuck section is deformed.

In contrast, in the electrostatic chuck device 1 of this embodiment, the respective coefficients of thermal expansion of the electrostatic chuck section 2, the first adhesive layer 4a, the inorganic ceramic membrane 4b, and the heater element 5 are set as described above. Specifically, in the electrostatic chuck device 1 of this embodiment, when the coefficient of thermal expansion of the electrostatic chuck section 2 is set to be A, the coefficient of thermal expansion of the heater element 5 is set to be B, and the coefficient of thermal expansion of the first adhesive layer 4a is set to be C, it is favorable if the relationship of $A<C<B$ or $A>C>B$ is satisfied.

Further, in the electrostatic chuck device 1 of this embodiment, when the coefficient of thermal expansion of the heater element 5 is set to be B, the coefficient of thermal expansion of the first adhesive layer 4a is set to be C, and the coefficient of thermal expansion of the inorganic ceramic membrane 4b is set to be D, it is favorable if the relationship of $B<D<C$ or $B>D>C$ is satisfied.

In a case where such relationships are satisfied, deformation of the device can be effectively suppressed even under a high-temperature use condition.

FIGS. 2A to 2D are explanatory views showing a method of manufacturing the electrostatic chuck device 1 of this embodiment and are process diagrams for describing processes of manufacturing the first adhesive layer 4a, the heater element 5, and the inorganic ceramic membrane 4b.

Figure 2A:
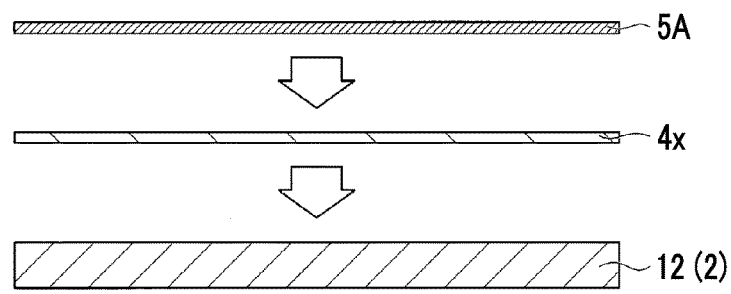
FIGS. 2A to 2D are explanatory views showing a method of manufacturing the electrostatic chuck device of the embodiment.

First, as shown in FIG. 2A, a metal thin film 5A which is the material of the heater element 5 is disposed on the surface of the supporting plate 12 configuring the electrostatic chuck section 2 with an inorganic adhesive material 4x interposed therebetween. As the inorganic adhesive material 4x, for example, a commercially available glass green sheet can be used.

Figure 2B:
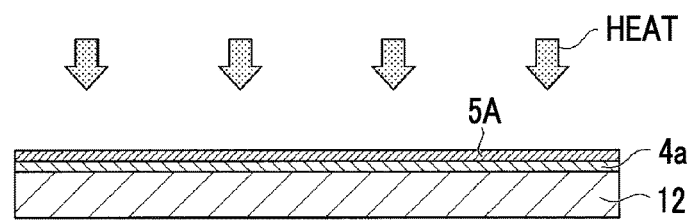

Subsequently, as shown in FIG. 2B, the first adhesive layer 4a is formed by calcinating the inorganic adhesive material 4x by heating the entirety of the supporting plate 12, the inorganic adhesive material 4x, and the metal thin film 5A. The formed first adhesive layer 4a bonds the metal thin film 5A to the supporting plate 12. The calcination conditions differ according to the inorganic adhesive material 4x which is used. However, an organic binder which is included in the inorganic adhesive material 4x disappears, and thus it is favorable if a temperature and time to the extent that particles of silica or alumina which is included in the inorganic adhesive material 4x are sintered are set.

Figure 2C:
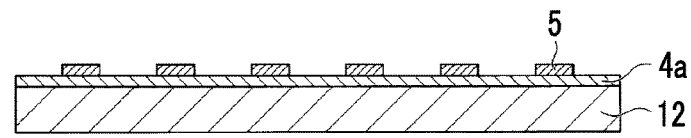

Subsequently, as shown in FIG. 2C, a mask is formed using a known photolithography method, and the metal thin film 5A is etched through the mask. In this way, the heater element 5 having a predetermined pattern is formed.

Figure 2D:
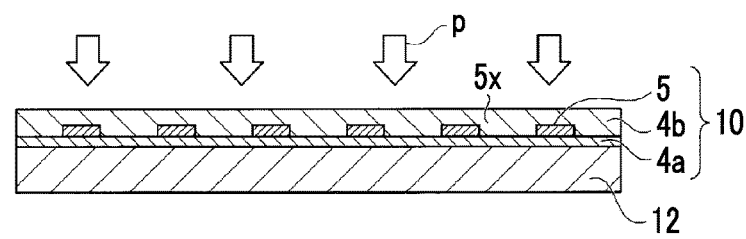

Subsequently, as shown in FIG. 2D, by plasma-spraying ceramic, ceramic particles p are deposited in gaps 5x of the heater element 5, thereby filling the gaps 5x. Further, by continuing the plasma spraying, the inorganic ceramic membrane 4b having a thermally-sprayed ceramic coating as a forming material thereof is formed, and thus the heater section 10 is formed.

Thereafter, a predetermined processing is performed on a laminated body of the obtained heater section 10 and the supporting plate 12, and thereafter, the laminated body is bonded to the temperature-controlling base section 3 through the second adhesive layer 8 (refer to FIG. 1) which comes into contact with the surface of the inorganic ceramic membrane 4b. In this way, the electrostatic chuck device 1 of this embodiment can be manufactured.

According to the electrostatic chuck device having the configuration as described above, it is possible to provide an electrostatic chuck device having high heat resistance, which can be used even under high-temperature environment.

The preferred embodiment according to the present invention has been described above with reference to the accompanying drawings. However, it goes without saying that the present invention is not limited to this embodiment. The shapes, combinations, and the like of the respective constituent members shown in the above-described embodiment are merely examples, and various modifications can be made based on design requirements or the like within a scope which does not depart from the gist of the present invention.

INDUSTRIAL APPLICABILITY

The electrostatic chuck device according to the present invention has high heat resistance and can be used even under high-temperature environment.

REFERENCE SIGNS LIST

1: electrostatic chuck device
2: electrostatic chuck section
4a: adhesive layer

4a: first adhesive layer
4b: inorganic ceramic membrane
5: heater element
8: second adhesive layer
19: placing surface
W: plate-shaped sample

The invention claimed is:

1. An electrostatic chuck device comprising:
an electrostatic chuck section comprising:
a placing plate having a placing surface for placing a plate-shaped sample on one main surface thereof;
a supporting plate integrated with the placing plate and supports the placing plate; and
an electrode for an electrostatic adsorption provided between the placing plate and the supporting plate;
a temperature-controlling base section which is provided on an other side of the electrostatic chuck section in relation to the placing surface to cool the electrostatic chuck section;
a heater element which is provided in a form of a layer between the electrostatic chuck section and the temperature-controlling base section; and
a first adhesive layer which is provided between the heater element and the electrostatic chuck section to adhere the heater element and the electrostatic chuck section to each other;
an inorganic ceramic membrane provided between the heater element and the temperature-controlling base section so that the heater element is embedded with the first adhesive layer and the inorganic ceramic membrane;
wherein the first adhesive layer is made of an inorganic glass or an inorganic material having a partially crystallized glass structure.

2. The electrostatic chuck device according to claim 1, wherein the inorganic ceramic membrane is a thermally-sprayed ceramic coating.

3. The electrostatic chuck device according to claim 2, wherein the thermally-sprayed ceramic coating is a thermally-sprayed coating of aluminum oxide or yttrium oxide.

4. The electrostatic chuck device according to claim 1 further comprising:
a second adhesive layer provided between the inorganic ceramic membrane and the temperature-controlling base section,
wherein the second adhesive layer comprises an organic adhesive agent.

5. The electrostatic chuck device according to claim 1,
wherein, when a coefficient of thermal expansion of the electrostatic chuck section is A, a coefficient of thermal expansion of the heater element is B, and a coefficient of thermal expansion of the first adhesive layer is C; then, there is a relationship among these coefficients: A<C<B or A>C>B.

6. The electrostatic chuck device according to claim 1, wherein the first adhesive layer is a green sheet.

7. The electrostatic chuck device according to claim 1,
wherein, when a coefficient of thermal expansion of the heater element is B, a coefficient of thermal expansion of the first adhesive layer is C, and a coefficient of thermal expansion of the inorganic ceramic membrane is D; then there is a relationship among these coefficients: B<D<C or B>D>C.

* * * * *